United States Patent
Zeng

(10) Patent No.: US 8,765,490 B2
(45) Date of Patent: Jul. 1, 2014

(54) SEMICONDUCTOR MAGNETORESISTIVE RANDOM-ACCESS MEMORY (MRAM) DEVICE AND MANUFACTURING METHOD THEREOF

(71) Applicants: Semiconductor Manufacturing International Corporation (Shanghai), Shanghai (CN); Semiconductor Manufacturing International Corporation (Beijing), Beijing (CN)

(72) Inventor: Gavin Zeng, Shanghai (CN)

(73) Assignees: Semiconductor Manufacturing International (Shanghai) Corporation (CN); Semiconductor Manufacturing International (Beijing) Corporation (CN)

( * ) Notice: Subject to any disclaimer, the term of this patent is extended or adjusted under 35 U.S.C. 154(b) by 0 days.

(21) Appl. No.: 13/654,321

(22) Filed: Oct. 17, 2012

(65) Prior Publication Data
US 2013/0119496 A1    May 16, 2013

(30) Foreign Application Priority Data
Nov. 15, 2011    (CN) .......................... 2011 1 0360297

(51) Int. Cl.
*H01L 29/82*    (2006.01)
(52) U.S. Cl.
USPC ............... 438/3; 257/421; 257/422; 257/423; 257/427; 257/E29.323; 365/157; 365/158; 365/171; 365/172; 365/173; 360/324.2; 360/326

(58) Field of Classification Search
USPC ........ 257/20, 414, 421–427, E29.323; 438/3; 365/157–158, 171–173; 360/324–326, 360/313
See application file for complete search history.

(56) References Cited

U.S. PATENT DOCUMENTS

| 6,859,388 | B1 | 2/2005 | Nahas et al. |
| 7,170,775 | B2 | 1/2007 | Lin et al. |
| 2007/0241410 | A1* | 10/2007 | Umehara et al. ............... 257/379 |
| 2009/0251955 | A1 | 10/2009 | Fukami et al. |

* cited by examiner

*Primary Examiner* — Jami M Valentine
(74) *Attorney, Agent, or Firm* — Innovation Counsel LLP

(57) ABSTRACT

The present disclosure describes a semiconductor MRAM device and a manufacturing method. The device reduces magnetic field induction "interference" (disturbance) phenomenon between adjacent magnetic tunnel junctions when data is written and read. This semiconductor MRAM device comprises a magnetic tunnel junction unit and a magnetic shielding material layer covering the sidewalls of the magnetic tunnel junction unit. The method for manufacturing a semiconductor device comprises: forming a magnetic tunnel junction unit, depositing an isolation dielectric layer to cover the top and the sidewall of the magnetic tunnel junction unit, and depositing a magnetic shielding material layer on the isolation dielectric layer.

9 Claims, 5 Drawing Sheets

SEMICONDUCTOR MAGNETORESISTIVE RANDOM-ACCESS MEMORY (MRAM) DEVICE AND MANUFACTURING METHOD THEREOF

CROSS-REFERENCE TO RELATED APPLICATIONS

This application claims priority to Chinese Patent Application No. CN201110360297.9 filed on Nov. 15, 2011 and entitled "Semiconductor Device and Manufacturing Method thereof", which is incorporated herein by reference in its entirety.

FIELD OF THE INVENTION

The present invention relates to the field of semiconductor memory technology, and more specifically relates to a semiconductor magneto resistive random-access memory (MRAM) device and a manufacturing method thereof.

DESCRIPTION OF THE RELATED ART

Magnetoresistive random-access memory (MRAM) is a non-volatile random-access memory technology that has been under development since the 1990s. A typical MRAM device stores data by means of magnetic storage elements, not in electric charge or current. The storage elements are formed from two ferromagnetic plates, each of which can hold a magnetic field. The ferromagnetic plates are separated by a thin insulating layer. One of the two plates is a permanent magnet set to a particular polarity, and the other plate's field can be changed to match an external field to store memory.

One kind of MRAM stores data in a magnetic tunnel junction (MTJ) device. A MTJ device comprises two magnetic films, that is, a pinned layer and a free layer. The magnetization direction of the pinned layer is fixed while the magnetization direction of the free layer can rotate freely. There is an insulating layer between the pinned layer and the free layer.

However, an MTJ MRAM device experiences noise from magnetic interference. Because an MRAM stores data in a MTJ device, when data bits are written to and read from an MTJ device, magnetic field induction appears between an MTJ and its adjacent MTJ(s), resulting in magnetic field induction "interference" (disturbance) phenomenon. This interference is undesirable, as it affects the accuracy and efficiency of the MTJ device in data writing and reading.

Currently, some of the common MRAM devices are: Astriod MRAM, spin torque transfer MRAM (STT MRAM) and toggle MRAM. However, these MRAM devices fail to overcome the magnetic field induction "interference" (disturbance) phenomenon between MTJs.

There is a need to eliminate magnetic field induction "interference" (disturbance) phenomenon between adjacent MTJs when data are written and read.

SUMMARY

According to a first aspect of the present disclosure, there is provided a method for manufacturing a semiconductor device, comprising: forming a magnetic tunnel junction unit; depositing an isolation dielectric layer to cover the top and the sidewall of the magnetic tunnel junction unit; and depositing a magnetic shielding material layer on the isolation dielectric layer, wherein the magnetic shielding material layer has a first portion that is located above the magnetic tunnel junction unit and a second portion that covers the sidewall of the magnetic tunnel junction unit and the isolation dielectric layer.

The magnetic shielding material of the magnetic shielding material layer may be a diamagnetic material including but not limited to aluminium and nickel iron alloy.

The first portion of the magnetic shielding material layer may be etched to expose the isolation dielectric layer on the top of the magnetic tunnel junction unit.

The method may further comprise depositing a first dielectric material layer such that it is higher than the first portion of the magnetic shielding material layer; performing chemical mechanical polishing to expose the first portion of the magnetic shielding material layer.

The magnetic shielding material layer is thick enough to make the chemical mechanical polishing stop at the magnetic shielding material layer.

During the etching process, the central part of the first portion of the magnetic shielding material layer may be removed while leaving the peripheral part of the first portion of the magnetic shielding material layer.

The closed loop may be processed to make it non-conductive.

The processing may include asking with oxygen.

The first portion of the magnetic shielding material layer may be etched through a dry etching process.

The method may comprise depositing a second dielectric material layer to cover the isolation dielectric layer on the top of the magnetic tunnel junction unit; etching the second dielectric material layer to form an opening to the isolation dielectric layer on the top of the magnetic tunnel junction unit; etching the isolation dielectric layer on top of the magnetic tunnel junction unit through the opening, to expose the top of the magnetic tunnel junction unit; and depositing a conductive material in the opening to form a contact on top of the magnetic tunnel junction unit, wherein the conductive material and the remaining part of the magnetic shielding material layer are electrically isolated from each other by the second dielectric material layer and the remaining part of the isolation dielectric layer.

The magnetic tunnel junction unit may be formed on the conductive material embedded in a dielectric layer and is electrically connected to the conductive material.

According to a second aspect of the present disclosure, there is provided a semiconductor device, comprising: a magnetic tunnel junction unit; and a magnetic shielding material layer covering the sidewall of the magnetic tunnel junction unit.

The shielding material of the magnetic shielding material layer may include Al, nickel iron alloy, or other diamagnetic material.

The semiconductor device may further comprise an isolation dielectric layer located between the sidewalls of the magnetic tunnel junction unit, wherein the isolation dielectric layer is between the magnetic tunnel function unit and the magnetic shielding material layer.

The isolation dielectric layer may be higher than the magnetic tunnel junction unit in a vertical direction.

The magnetic shielding material layer may be higher than the isolation dielectric layer in the vertical direction, and the portion of the magnetic shielding material layer that is higher than the isolation dielectric layer is an oxide of the magnetic shielding material.

The semiconductor device may further comprise: a first dielectric layer into which the magnetic tunnel junction unit, the isolation dielectric layer and the magnetic shielding material layer are embedded, wherein the first dielectric layer and the magnetic shielding material layer are substantially the same in height; a second dielectric layer above the first dielectric layer and the magnetic tunnel junction unit; and a conductive contact that extends through the second dielectric layer and the isolation dielectric layer to electrically connect with the top of the magnetic tunnel junction unit, wherein the upper portion of the isolation dielectric layer contacts the conductive contact and the second dielectric layer, and wherein the conductive contact and the magnetic shielding material layer are electrically isolated from each other by the second dielectric material layer and the isolation dielectric layer.

The present disclosure helps reduce or even eliminate magnetic field induction "interference" (disturbance) between adjacent MTJs when data are wrote and read by surrounding the MTJs with magnetic shielding material, thereby improving the accuracy and efficiency of MRAM in data writing and reading.

Further features of the present disclosure and advantages thereof will become apparent from the following detailed description of exemplary embodiments according to the present disclosure with reference to the accompanying drawings.

BRIEF DESCRIPTION OF THE DRAWINGS

The accompanying drawings, which are incorporated in and constitute a part of the specification, illustrate embodiments of the disclosure and, together with the description, serve to explain the principles of the disclosure.

With reference to the drawings, the present disclosure can be more clearly understood based on the following detailed description. In the figures.

DESCRIPTION OF THE EMBODIMENTS

Figure 1:
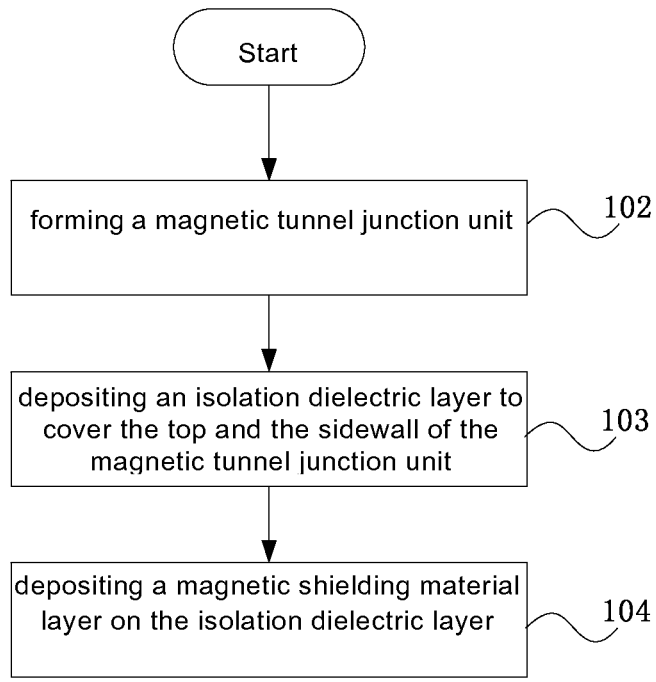
FIG. 1 is a flowchart showing various steps of the method for manufacturing a MRAM device according to the first embodiment of the present disclosure.

Various exemplary embodiments of the present disclosure will now be described in detail with reference to the drawings. It should be noted that the relative arrangement of the components and steps, the numerical expressions, and numerical values set forth in these embodiments do not limit the scope of the present disclosure unless it is specifically stated otherwise.

Meanwhile, it should be understood that each component in the figures has been drawn for convenience of description and not necessarily to scale.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the figures, and thus once an item is defined in one figure, its description may not be repeated in the subsequent figures.

Figure 2A:
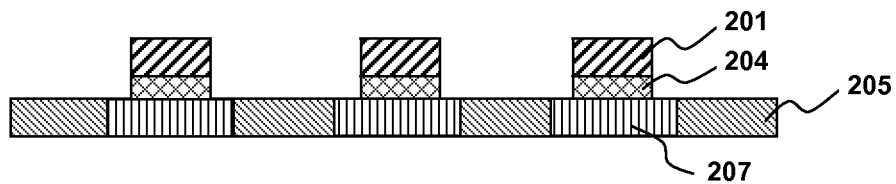
FIGS. 2A~2C are schematic cross-sectional views of the semiconductor device according to the first embodiment of the present disclosure at each stage of the manufacturing process.
Figure 2B:
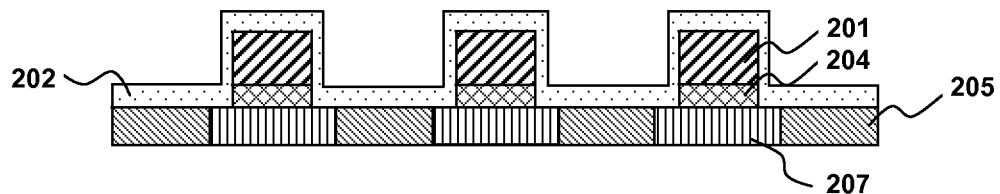
Figure 2C:
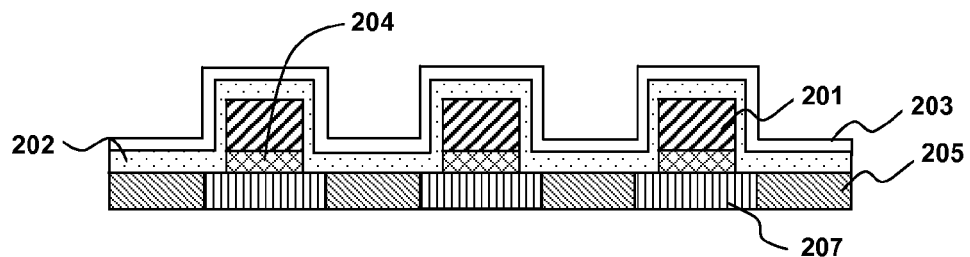

FIGS. 2A~2C are schematic cross-sectional views of the semiconductor device according to the first embodiment of the present disclosure at each stage of the manufacturing process.

First, as shown in FIG. 2A, a magnetic tunnel junction unit 201 is formed on a substrate with a dielectric layer 205 thereon. The forming of the magnetic tunnel junction unit 201 can be realized through the use of various technologies, for example, first forming stacked layers of magnetic tunnel junction and then forming the magnetic tunnel junction unit by dry etching. The dielectric layer 205 has a conductive contact 207 therein, for example, a copper plug. The conductive contact 207 is located below the magnetic tunnel junction unit 201. The magnetic tunnel junction unit 201 can be formed by means of various technologies. Optionally, there can be an isolation layer 204 between the magnetic tunnel junction unit 201 and the conductive contact 207 in the dielectric layer 205, and the material of the optional isolation layer 204 can be TaN or TiN.

Next, as shown in FIG. 2B, an isolation dielectric layer 202 is deposited over the structure in FIG. 2A to cover the top and the sidewalls of the magnetic tunnel junction unit 201. The material of the isolation dielectric layer may include SiN or $SiO_2$.

Next, as shown in FIG. 2C, a magnetic shielding material layer 203 is deposited on the isolation dielectric layer 202. The formed magnetic shielding material layer 203 includes a first portion that is located above the magnetic tunnel junction unit 201 and a second portion that is adjacent to the sidewall of the magnetic tunnel junction unit 201. The magnetic shielding material may include aluminium, nickel iron alloy, or another diamagnetic material.

The magnetic shielding material layer 203 protects the magnetic tunnel junction unit 201 from the magnetic field induction "interference" generated by adjacent magnetic tunnel junction units during data writing and reading. Thus, MRAM's accuracy and efficiency are improved in data writing and reading.

FIGS. 3A~3K are schematic cross-sectional views of the semiconductor MRAM device according to another embodiment of the present disclosure at each stage of the manufacturing process.

Figure 3A:
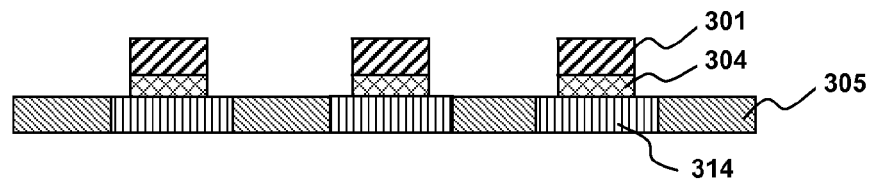
FIGS. 3A~3K are schematic cross-sectional views of the semiconductor device according to another embodiment of the present disclosure at each stage of the manufacturing process.

As shown in FIG. 3A, a magnetic tunnel junction unit 301 is formed on a substrate with a dielectric layer 305 thereon. The dielectric layer 305 has a conductive contact 314 therein, for example, a copper plug. The conductive contact 314 is located below the magnetic tunnel junction unit 301. Optionally, there can be a conductive isolation layer 304 between the magnetic tunnel junction unit 301 and the conductive contact 314 in the dielectric layer 305, which isolates the conductive contact 314 from the magnetic tunnel junction unit 301. The material of the optional isolation layer 304 can be TaN or TiN.

In embodiments with no isolation layer 304, the conductive contact 314 is electrically connected to the magnetic tunnel junction unit 301 that is formed on it.

Figure 3B:
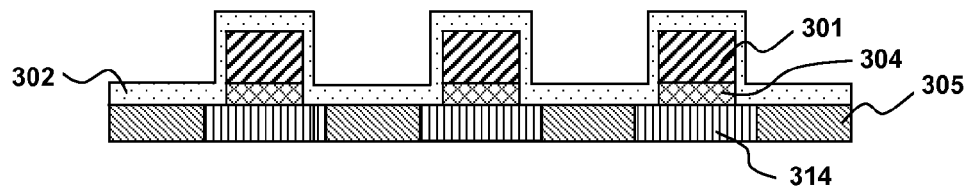

Next, as shown in FIG. 3B, an isolation dielectric layer 302 is deposited on the top and sidewalls of the magnetic tunnel junction unit 301. Material of the isolation dielectric layer 302 may include various dielectric materials such as Nitrogen-doped SiC (NDC), black diamond (BD), SiN or $SiO_2$.

Figure 3C:
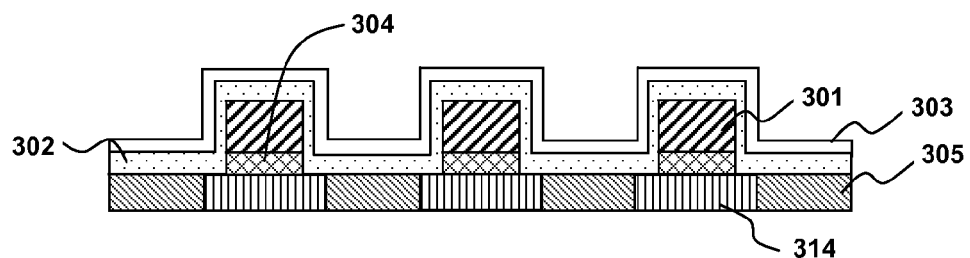

Next, as shown in FIG. 3C, a magnetic shielding material layer 303 is deposited on the isolation dielectric layer 302. The formed magnetic shielding material layer 303 includes a first portion that is located above the magnetic tunnel junction unit 301 and a second portion that is adjacent to the sidewalls of the magnetic tunnel junction unit 301. A magnetic shielding material includes various shielding material such as aluminium.

Figure 3D:
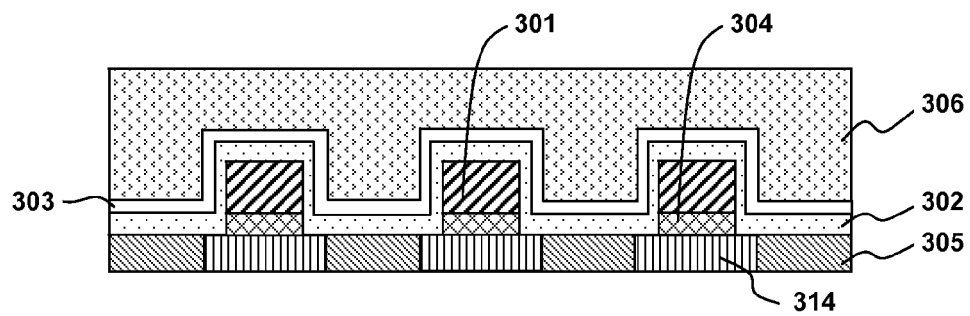

Next, as shown in FIG. 3D, another dielectric material layer 306 is deposited on the magnetic shielding material layer 303 to fully cover the magnetic shielding material layer 303.

Figure 3E:
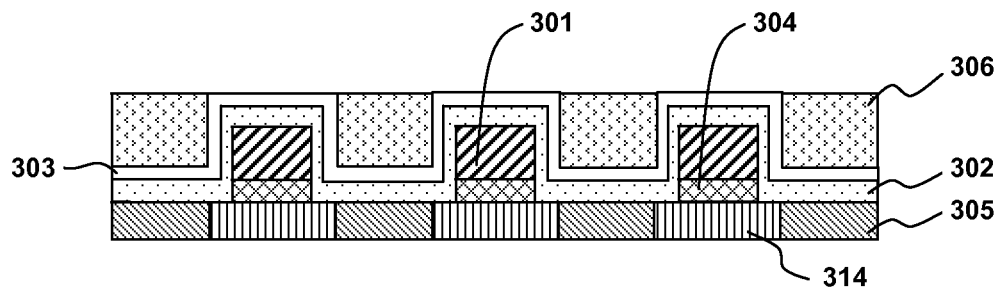

Then, as shown in FIG. 3E, the surface of the first dielectric material layer 306 is subject to chemical mechanical polishing, thereby exposing the first portion of the magnetic shielding material layer 303 (a portion of the magnetic shielding material layer 303 that is above the magnetic tunnel junction unit 301). The magnetic shielding material layer 303 is thick enough, such that it is possible to control the chemical mechanical polishing to stop on top of the layer, leaving the first portion of the magnetic shielding material layer 303 substantially intact.

Figure 3F:
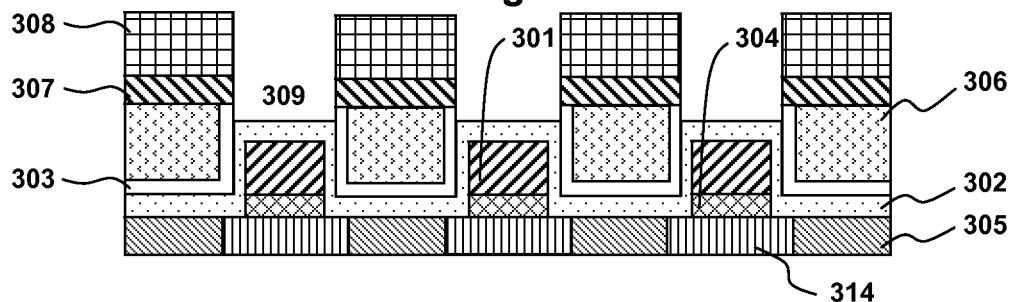

Next, as shown in FIG. 3F, the first portion of the magnetic shielding material layer 303 (a portion of the magnetic shielding material layer 303 that is above the magnetic tunnel junction unit 301) is etched to expose the isolation dielectric layer 302 on top of the magnetic tunnel junction unit 301, thereby forming an opening 309. The opening 309 can be formed through the use of various techniques. For example, the opening 309 can be formed by a photolithography and dry etching process using a hard mask 308 on a photo-resist 307. During the etching process, the central part of the first portion of the magnetic shielding material layer 303 (a portion of the magnetic shielding material layer 303 that is above the magnetic tunnel junction unit 301) is removed while the peripheral part of the first portion of the magnetic shielding material layer 303 is maintained, thereby forming a protective holder under the resist 307.

Figure 3G:
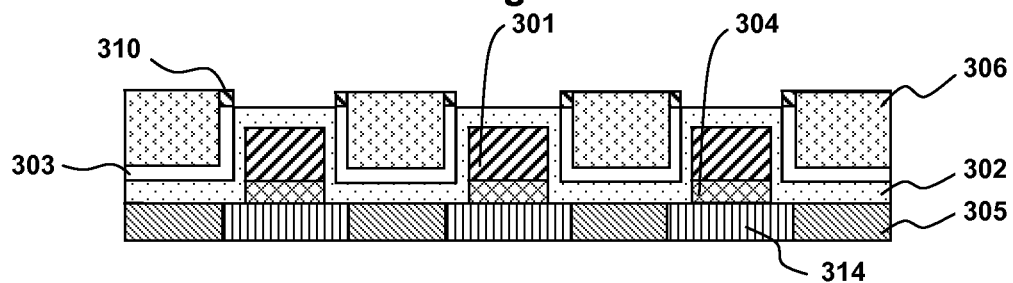

Next, as shown in FIG. 3G, the protective holder of the magnetic shielding material layer 303 is non-conductive. The protective holder of the magnetic shielding material layer 303 will go through asking with oxygen such that the protective holder is oxidized, thereby forming an oxidation layer 310. When the material of the magnetic shielding material layer 303 is aluminium, the material of the oxidation layer 310 is $Al_2O_3$.

Figure 3H:
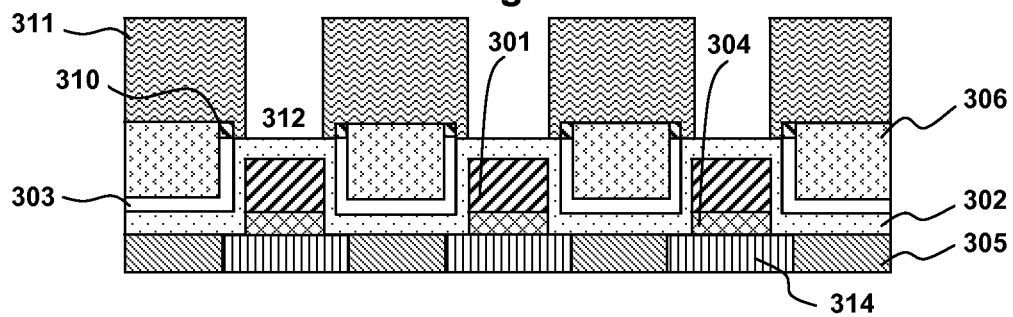

Then, as shown in FIG. 3H, a second dielectric material layer 311 is deposited over the full structure and an opening is formed in the isolation dielectric layer 310 over top of the magnetic tunnel junction unit 301. This may be realized through the following steps: depositing the second dielectric material layer 311 over the semiconductor device (after removing the hard mask and the photo-resist) to cover the isolation dielectric layer 302 on the top of the magnetic tunnel junction unit 301, and etching the second dielectric material layer 311, to form the opening 312 to the isolation dielectric layer 302 on top of the magnetic tunnel junction unit 301. The opening 312 can be formed through the use of various technologies, for example, by photolithography and dry etching.

Figure 3I:
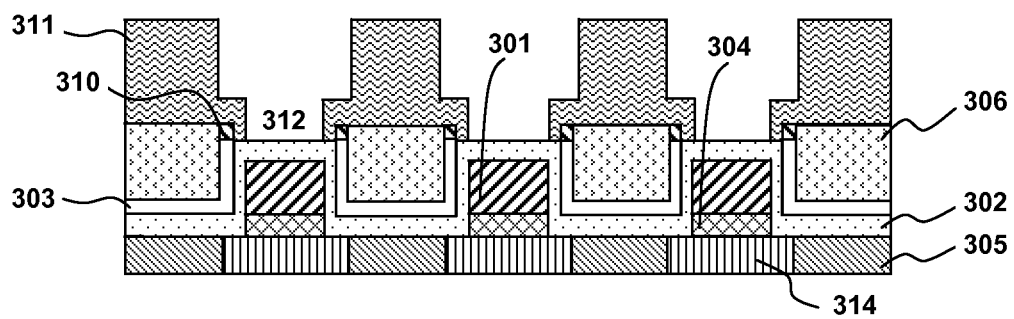
Figure 3J:
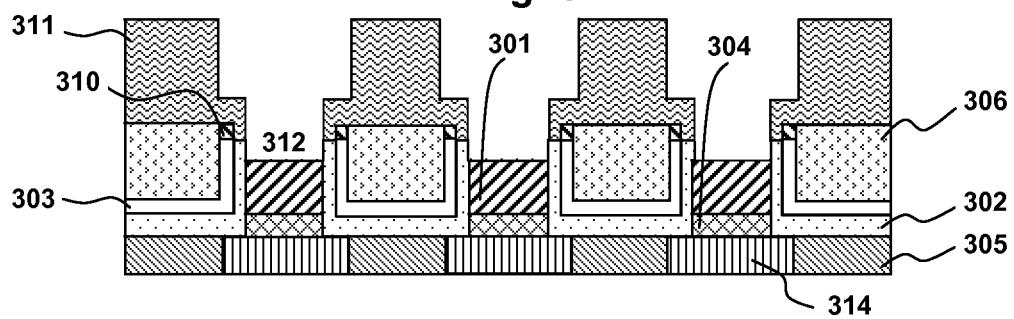

Preferably, as shown in FIG. 3I, the second dielectric material layer 311 may be etched using a dual damascene process to generate an additional opening 312, which is then shaped into a wedge-like hole, thereby facilitating the implantation of conductive materials in the subsequent processes. Next, as shown in FIG. 3J, the isolation dielectric layer 302 is etched through the opening 312 to expose the top of the magnetic tunnel junction unit 301.

Figure 3K:
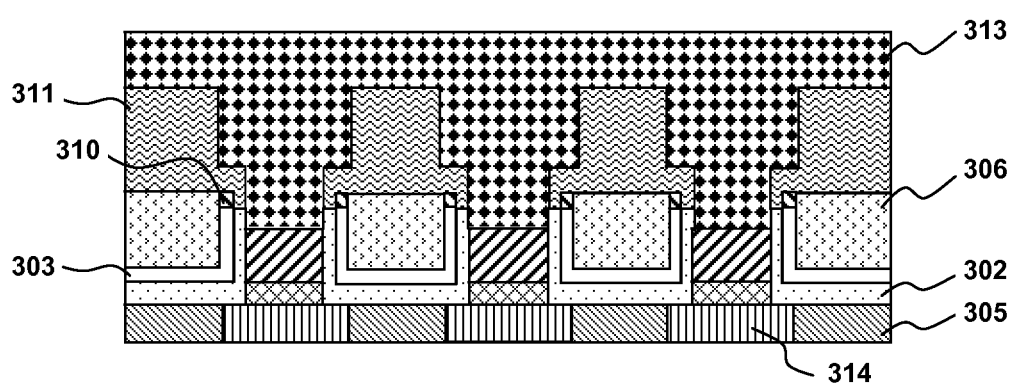

Next, as shown in FIG. 3K, conductive material 313 fills opening 312, contacting the magnetic tunnel junction unit 301. The conductive material 313 and the remaining part of the magnetic shielding material layer 303 are electrically isolated from each other by the second dielectric material layer 311 and the remaining part of the isolation dielectric layer 302 therebetween. The magnetic tunnel junction unit 301 is formed above the conductive material 314 (copper electrode) embedded in the dielectric layer 305 and is electrically connected to the conductive material 313. The conductive material 313 can be any of various conductive materials, such as copper, aluminium, or tungsten. The filling process can be an electroplating process.

As such, in the semiconductor device obtained through the steps shown in FIGS. 3A~3K, the magnetic shielding material layer 303 covers the magnetic tunnel junction unit 301. The magnetic shields reduce or eliminate the magnetic field induction cross-talk noise between adjacent magnetic tunnel junction units when data is written and read, thereby mitigating the "interference" (disturbance) phenomenon and improving the accuracy and efficiency of the memory device.

Figure 4:
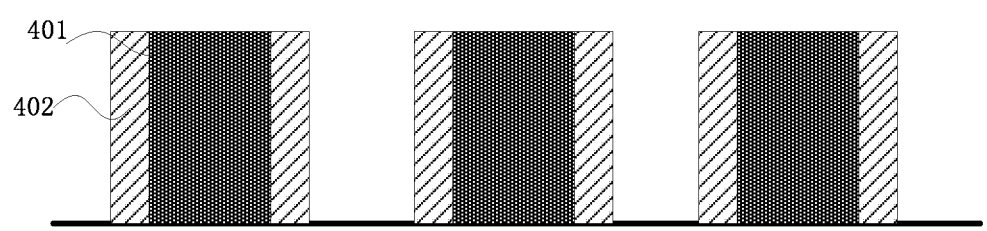
FIG. 4 is a diagram showing the structure of the semiconductor device according to one embodiment of the present disclosure.

FIG. 4 is a diagram showing the structure of a semiconductor MRAM device fabricated according to one embodiment described above.

The semiconductor device as shown in FIG. 4 comprises a magnetic tunnel junction unit 401 and a magnetic shielding material layer 402 that surrounds the sidewalls of the magnetic tunnel junction unit 401.

The magnetic shielding material layer 402 eliminates the magnetic field induction intensity among adjacent magnetic tunnel junction units when data is written and read, therefore mitigating "interference" (disturbance) phenomenon. The magnetic shielding material may include aluminium, nickel iron alloy, or a diamagnetic material.

Figure 5:
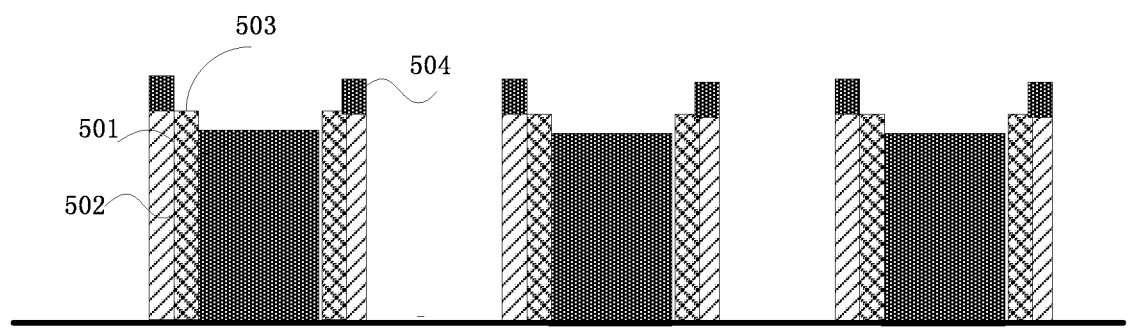
FIG. 5 is a diagram showing the structure of the semiconductor device according to another embodiment of the present disclosure.

FIG. 5 is a diagram showing the structure of a semiconductor device according to another embodiment of the present disclosure.

The semiconductor device as shown in FIG. 5 comprises a magnetic tunnel junction unit 501 and a magnetic shielding material layer 502 which surrounds the sidewalls of the magnetic tunnel junction unit 501. The sidewalls of the magnetic tunnel junction unit 501 and the magnetic shielding material layer 502 have an isolation dielectric layer 503 in-between.

The isolation dielectric layer 503 is higher than the magnetic tunnel junction unit 501 along the vertical direction.

The magnetic shielding material layer 502 is higher than the isolation dielectric layer 503 in the vertical direction. The magnetic shielding material layer 502 is higher than the isolation dielectric layer 503 by an oxide layer 504 which grows over the magnetic shielding material 502.

Aluminium, nickel iron alloy, or a diamagnetic material may be selected as the material of the magnetic shielding material layer 502. The material of the oxide 504 is $Al_2O_3$.

Figure 6:
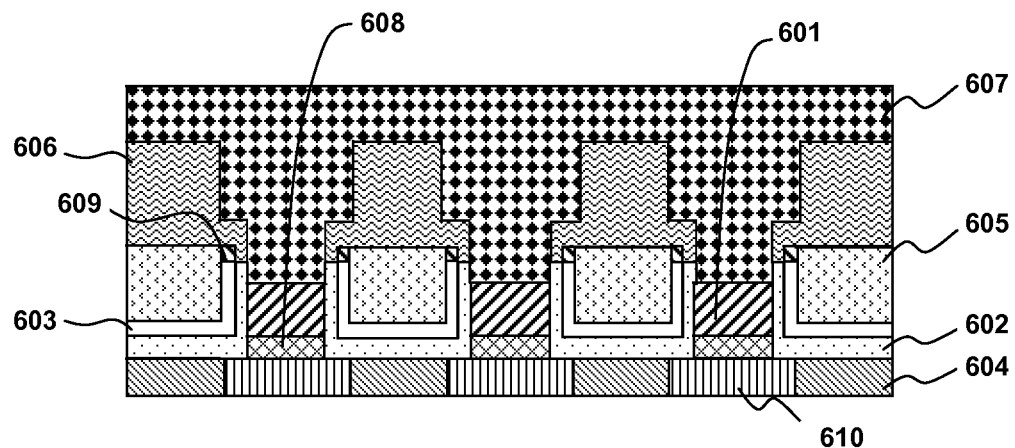
FIG. 6 is a diagram showing the structure of the semiconductor device according to a further embodiment of the present invention.

FIG. 6 is a diagram showing a semiconductor device according to another embodiment of the present disclosure. The embodiment of FIG. 6 is substantially the same as the embodiment of FIG. 3K.

The semiconductor device as shown in FIG. 6 comprises a magnetic tunnel junction unit 601 and a magnetic shielding material layer 603 that surrounds the sidewalls of the magnetic tunnel junction unit 601. The sidewalls of the magnetic tunnel junction unit 601 and the magnetic shielding material layer 603 have an isolation dielectric layer 602 therebetween.

The isolation dielectric layer 602 is higher than the magnetic tunnel junction unit 601 in a vertical direction.

The magnetic shielding material layer 603 is higher than the isolation dielectric layer 602 in the vertical direction, and the portion of the magnetic shielding material layer 603 that is higher than the isolation dielectric layer 602 is an oxide layer 609.

The semiconductor device further comprises a base dielectric layer 604 which includes a conductive contact 610 (e.g. copper plug) therein. The semiconductor device further comprises a first dielectric layer 605 in which the magnetic tunnel junction unit 601, the isolation dielectric layer 602 and the magnetic shielding material layer 603 are embedded. The top surface of the first dielectric layer 605 is at substantially the same height as the combination of the magnetic shielding material layer 603 and the oxide layer 609.

A second dielectric layer 606 is located above the first dielectric layer 605 and the magnetic tunnel junction unit 601.

The semiconductor device further comprises a conductive contact 607 that fills the openings in the second dielectric layer 606 and the isolation dielectric layer 602 to electrically connect with the top of the magnetic tunnel junction unit 601.

The upper portion of the isolation dielectric layer 602 surrounds the portion of the conductive contact 607 that is closest to the magnetic tunnel junction unit 601 and contacts the second dielectric layer 606.

The conductive contact 607 and the magnetic shielding material layer 603 are electrically isolated by the second dielectric material layer 606 and the isolation dielectric layer 602 therebetween.

FIG. 1 is a flowchart showing various steps of the method for manufacturing a semiconductor device according to the first embodiment of the present invention.

As shown in the figure, first, a magnetic tunnel junction unit is formed at step 102. The forming of the magnetic tunnel junction unit can be realized through the use of various technologies, for example, first forming stacked layers of magnetic tunnel junction and then forming the magnetic tunnel junction unit by dry etching.

At step 103, an isolation dielectric layer is deposited to cover the top and the sidewall of the magnetic tunnel junction unit. As for the material of the isolation dielectric layer, various known dielectric materials can be employed, such as, SiN, SiO$_2$, NDC (Nitrogen doped SiC), BD (black diamond, black diamond low-k material) and BLK (Black low K, black low-k material).

At step 104, a magnetic shielding material layer is deposited on the isolation dielectric layer, wherein the formed magnetic shielding material layer includes a first portion that is located above the magnetic tunnel junction unit and a second portion that is adjacent to the sidewall of the magnetic tunnel junction unit with the isolation dielectric layer therebetween. As for the magnetic shielding material, various shielding materials such as aluminium can be employed.

As such, since the magnetic shielding material layer in the above semiconductor material surrounds the magnetic tunnel junction unit, the magnetic shielding material reduces or eliminates the magnetic induction intensity between adjacent magnetic tunnel junction units when data is written and read, therefore mitigating "interference" (disturbance) phenomenon, and can thus improve the accuracy and efficiency of the semiconductor material in data reading and writing.

So far, the method for manufacturing a semiconductor device according to the present invention as well as the semiconductor device formed through the use of this method has been described in detail. In order to not obscure the concept of the present invention, some details known in the art are not described herein. One of ordinary skill in the art would know how to implement the technical solution disclosed herein based on the above description.

Although some specific embodiments of the present invention have been demonstrated with examples, it should be understood by one of ordinary skill in the art that the above examples are only intended to be illustrative and not to limit the scope of the present invention. It should be understood by one of ordinary skill in the art that the above embodiments can be modified without departing from the scope and spirit of the present invention. The scope of the present invention is defined by the attached claims.

What is claimed is:

1. A method for manufacturing a semiconductor device, comprising:
    forming a magnetic tunnel junction unit having a top and sidewalls;
    depositing an isolation dielectric layer to cover the top and the sidewalls of the magnetic tunnel junction unit;
    depositing a magnetic shielding material layer on the isolation dielectric layer, wherein the magnetic shielding material layer has a first portion that is located above the magnetic tunnel junction unit and a second portion that covers the sidewalls of the magnetic tunnel junction unit and the isolation dielectric layer;
    etching the first portion of the magnetic shielding material layer by removing a central part of the first portion while leaving a peripheral part of the first portion; and
    processing the peripheral part of the first portion of the magnetic shielding material layer to make it non-conductive.

2. The method of claim 1, wherein the magnetic shielding material of the magnetic shielding material layer includes aluminium, nickel iron alloy, or a material with diamagnetic property.

3. The method of claim 1, wherein the isolation dielectric layer on the top of the magnetic tunnel junction unit is exposed after etching the first portion of the magnetic shielding material layer.

4. The method of claim 3, further comprising, before etching the first portion of the magnetic shielding material layer:
    depositing a first dielectric material layer which is higher than the first portion of the magnetic shielding material layer; and
    performing chemical mechanical polishing to expose the first portion of the magnetic shielding material layer.

5. The method of claim 4, wherein the magnetic shielding material layer is sufficiently thick to stop the chemical mechanical polishing.

6. The method of claim 1, wherein the processing includes ashing with oxygen.

7. The method of claim 3, wherein the first portion of the magnetic shielding material layer is etched by a dry etching process.

8. The method of claim 3, comprising:
    depositing a second dielectric layer to cover the isolation dielectric layer on the top of the magnetic tunnel junction unit;
    etching the second dielectric material layer to form an opening to the isolation dielectric layer on the top of the magnetic tunnel junction unit;

etching the isolation dielectric layer on top of the magnetic tunnel junction unit through the opening, to expose the top of the magnetic tunnel junction unit; and depositing a conductive material in the opening to form a contact on top of the magnetic tunnel junction unit, wherein the conductive material and the remaining part of the magnetic shielding material layer are electrically isolated from each other by the second dielectric material layer and the remaining part of the isolation dielectric layer.

9. The method of claim 1, wherein the magnetic tunnel junction unit is formed on the conductive material embedded in a dielectric layer and is electrically connected to the conductive material.

* * * * *